United States Patent [19]

Takeda et al.

[11] Patent Number: 4,779,217

[45] Date of Patent: Oct. 18, 1988

[54] OCTAVE MULTIPLE FILTER

[75] Inventors: Shigeki Takeda, Tokyo; Hiroo Uwaba; Akihiro Takahashi, both of Kanagawa, all of Japan

[73] Assignee: Kyocera Corporation, Kyoto, Japan

[21] Appl. No.: 943,448

[22] Filed: Dec. 16, 1986

[30] Foreign Application Priority Data

Dec. 27, 1985 [JP] Japan .................. 60-296678
Aug. 11, 1986 [JP] Japan .................. 61-189118
Aug. 21, 1986 [JP] Japan .................. 61-194039

[51] Int. Cl.$^4$ .............................................. G06F 7/38
[52] U.S. Cl. .................................................. 364/724.16
[58] Field of Search .......................... 364/724; 333/18; 375/11-14

[56] References Cited

U.S. PATENT DOCUMENTS 4,157,457  6/1979  Sakoe et al. .................... 364/724 X
4,649,507  3/1987  Inaba et al. ........................ 364/724

Primary Examiner—Gary V. Harkcom
Assistant Examiner—Tan V. Mai
Attorney, Agent, or Firm—Spensley Horn Jubas & Lubitz

[57] ABSTRACT

An octave multiple filter is provided in which a plurality of filter stages which includes a pair of digital filters (FIR type filters), one having band pass characteristics and the other having low pass characteristics, are arranged between the input and the output according to a predetermined rule, so that their characteristics can be specified with logarithmically uniform intervals in a wide frequency region.

4 Claims, 9 Drawing Sheets

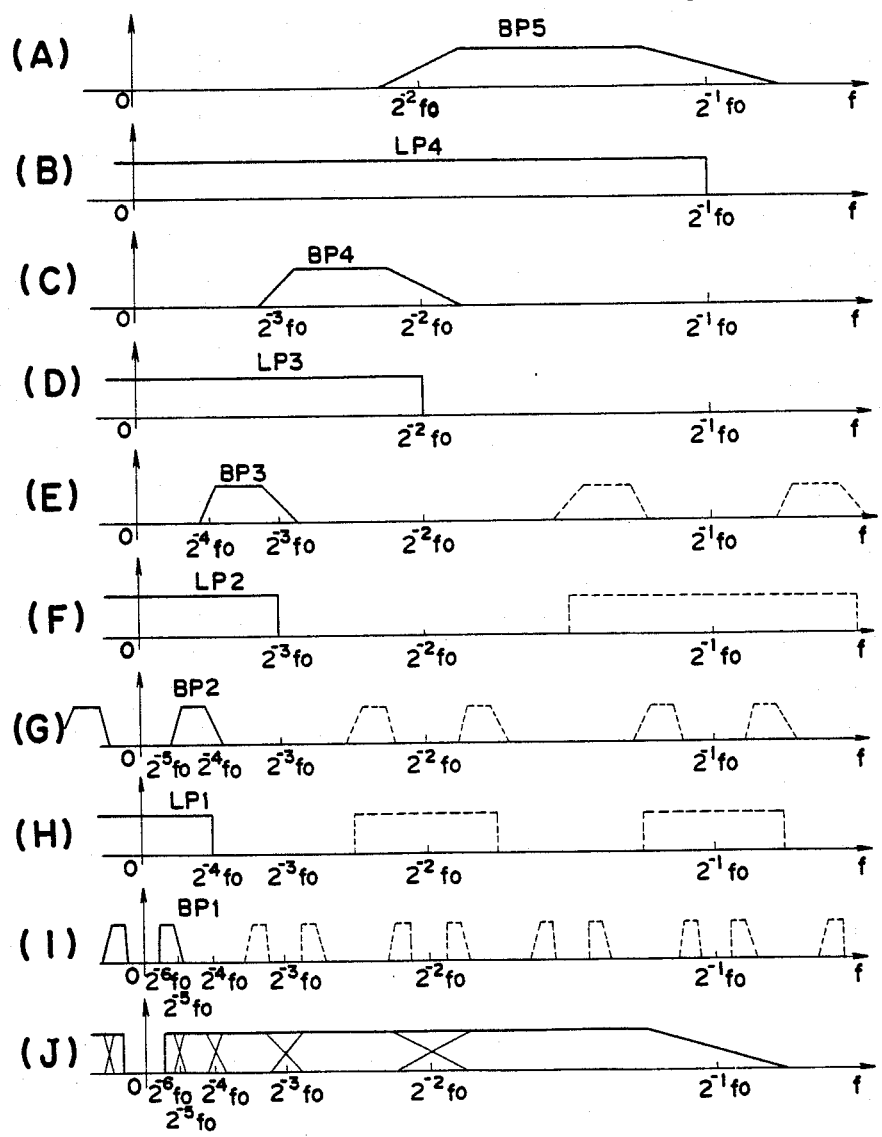

OCTAVE MULTIPLE FILTER

FIELD OF THE INVENTION

This invention relates to an octave multiple filter composed of digital filters having low path characteristics and those having band pass characteristics combined with a certain rule.

BACKGROUND OF THE INVENTION

Since a prior art digital filter is adapted to operate with a predetermined dock frequency for processing a certain number of sampled discrete signals separated with an isochronal interval, its characteristics in a relevant frequency region was specified with a constant frequency interval.

For this reason, for filters, whose characteristics were specified with a logarithmic interval in a wide frequency region, were known only those constituted by combinations of a plurality of analogue filters.

Since in the formers, i.e. digital filters, their characteristics are specified with a constant frequency interval, as described above, their resolving power is too rough in the low frequency region and to the contrary unnecessarily fine in the high frequency region. Therefore it is very difficult to make the frequency band of this kind of filters wider.

In general, evaluation or specification of the characteristics of audio devices is effected with logarithmic intervals in the frequency region. Consequently, in the case whose digital filters, e.g. FIR (finite impulse response) type filters were used, for the reason described above it was practically not possible to specify the characteristics with a high precision for the low frequency region and to the contrary the characteristics were specified with an unnecessarily high precision for the high frequency region. Therefore, design to realize circuits of the digital filter described above was very complicated and not efficient. In particular, in the case where it was tried to realize a circuit having complex frequency characteristics such as a graphic equalizer by means of prior art FIR type filters, such a restriction cannot be avoided and in fact any graphic equalizers utilizing FIR type filters have never been used in practice.

On the other hand, since the latter, i.e. analogue filters, were so constructed that they were driven according to a method, by which analogue active filters were added to or multiplied by each other, interference was produced between different filters or it was difficult to specify the phase and the amplitude thereof independently. In particular, it was very difficult to specify arbitrarily their phase characteristics, thereof.

OBJECT OF THE INVENTION

The object of this invention is to provide an octave multiple filter permitting to overcome such problems of the prior art techniques and to specify characteristics with logarithmically uniform intervals in a wide frequency region.

SUMMARY OF THE INVENTION

In order to achieve this object, an octave multiple filter according to a first invention of this application includes circuitry for sampling input signals; and a plurality of filter stages connected so that the sampled input signals are given them in parallel, each of which consists of a pair of digital filters, one having band pass characteristics and the other having low pass characteristics, driven by clock signals having a time interval, which in equal to the sampling time interval; the digital filters having the band pass characteristics being composed of delay element driven with a time interval, whose delay time per stage is an integer times as long as the sampling time interval; the digital filters having the low pass characteristics including delay elements driven with a delay time, which is equal to one of integer divisions of every the delay time per stage of the delay element in the digital filters; each of the filter stages having so constructed that a digital filter stage having the band pass characteristics and the low pass characteristics including delay elements driven with a longer delay time belongs to a higher rank and that the output of the digital filter having the band pass characteristics in a relevant filter stage is added to the output of the digital filter having the low pass characteristics in the filter stage, which is higher by 1 than the relevant filter stage, and then inputted to the digital filter having the low pass characteristics in the relevant filter stage itself.

An octave multiple filter according to a second invention of this application includes circuitry for sampling input signals; and a plurality of filter groups, one having band pass characteristics and the other having low pass characteristics, driven by clock signals having a time interval, which is equal to the sampling time interval; the filters in the digital filter group having the low pass characteristics being connected in series; the filters in the digital filter group having the band pass characteristics being connected in parallel; the sampled input signals being given to each of the filters in the digital filters group having the band pass characteristics; the output of each of the filters being given to the corresponding filter in the digital filter group having the low pass characteristics; the filters in each of the filter groups being numbered according to the order of their connection; the delay time per stage of the unit delay element in the digital filter having the greatest number being shorter than the sampling time interval of the input signals; in each of the digital filter groups, every time the number of the filter is reduced by 1, the delay time per stage of the difital filter being determined by multiplying the delay time of the filter having the preceding number by $A^B(A>1, B>0)$; the delay time per stage of the unit delay element in the digital filter having the low pass characteristics of an arbitrary number being an integer times as long as the delay time per stage of the unit delay element in the digital filter having the band pass characteristics of the same number.

An octave multiple filter according to a third invention of this application includes circuitry for sampling input signals; and a plurality of filter groups, one having band pass characteristics and the other having low pass characteristics, driven by clock signals having a time interval, which is equal to the sampling time interval; the filters in the digital filter group having the low pass characteristics being connected in series; the filters in the digital filter group having the band pass characteristics being connected in parallel; the output of each of the filters in the digital filter group having the low pass characteristics being given to the corresponding filter in the digital filter group having the band pass characteristics; at the same time the outputs of the filters in the digital group having the band pass characteristics being added together and taken out; the filters in each of the digital filter group being numbered according to the order of their connection; the delay time per stage of the unit delay element in the digital filter having the greatest number being shorter than the sampling time interval of the input signals; in each of the digital filter group, every time the number of the filter is reduced by 1, the delay time per stage of the digital filter being determined by multiplying the delay time of the filter having the preceding number by $A^B(A>1, B>0)$; the delay time per stage of the unit delay element in the digital filter having the low pass characteristics of an arbitrary number being an integer times as long as the delay time per stage of the unit delay element in the digital filter having the band pass characteristics of the same number.

An octave multiple filter according to a fourth invention of this application includes circuitry for sampling input signals; a plurality of filter groups, one having band pass characteristics and the other having low pass characteristics, driven by clock signals having a time interval, which is equal to the sampling time interval; the filters in the digital filter group having the low pass characteristics being connected in series; the filters in the digital filter group having the band pass characteristics being connected in parallel; the output of each of the filters in the digital filter group having the low pass characteristics being given to the corresponding filter in the digital filter group having the band pass characteristics; at the same time the outputs of the filters in the digital filter group having the band pass characteristics being added together through each of amplitude-phase coefficient controller circuits and taken out; the filters in each of the digital filter group being numbered according to the order of their connection; the delay time per stage of the unit delay element in the digital filter having the greatest number being shorter than the sampling time interval of the input signals; in each of the digital filter group, every time the number of the filter is reduced by 1, the delay time per stage of the digital filter being determined by multiplying the delay time of the filter having the preceding number by $A^B(A>1, B>0)$; the delay time per stage of the unit delay element in the digital filter having the low pass characteristics of an arbitrary number being an integer times as long as the delay time per stage of the unit delay element in the digital filter having the band pass characteristics of the same number; and control means for controlling the constants of each of the amplitude-phase coefficient controller circuits, depending on the output signal of each of the filters in the digital filter group.

In the first invention of this application described above, as the digital filters having the low pass characteristics and those having the band pass characteristics, e.g. FIR type filters are used. The digital filters having the low pass characteristics operates so as to eliminate the pass bands of the odd numbers of the digital filters having the band pass characteristics. Each of the filter stages is composed of the two kinds of filters. The assembly of the filters can be used in a multiple manner by varying the unit delay time of the delay elements constituting each digital filter stage.

The second and third inventions of this application are basically equivalent to the first invention. Consequently their operating mode is completely identical.

In the octave multiple filter according to the fourth invention of this application, the output signals of the digital filters having the low pass characteristics pass through the filters connected in series one after another and thus their band width is made narrower successively. At the same time the output signal of each of the digital filters having the low pass characteristics is multiplied by the band pass characteristics and given to an amplitude-phase coefficient controller circuit. In this way, the amplitude and the phase of each of the output signals can be adaptively controlled.

BRIEF DESCRIPTION OF THE DRAWINGS

FIG. 12(a) to (j) indicate output characteristics of each of the digital filters in the embodiment indicated in FIG. 9.

DETAILED DESCRIPTION

Figure 1:
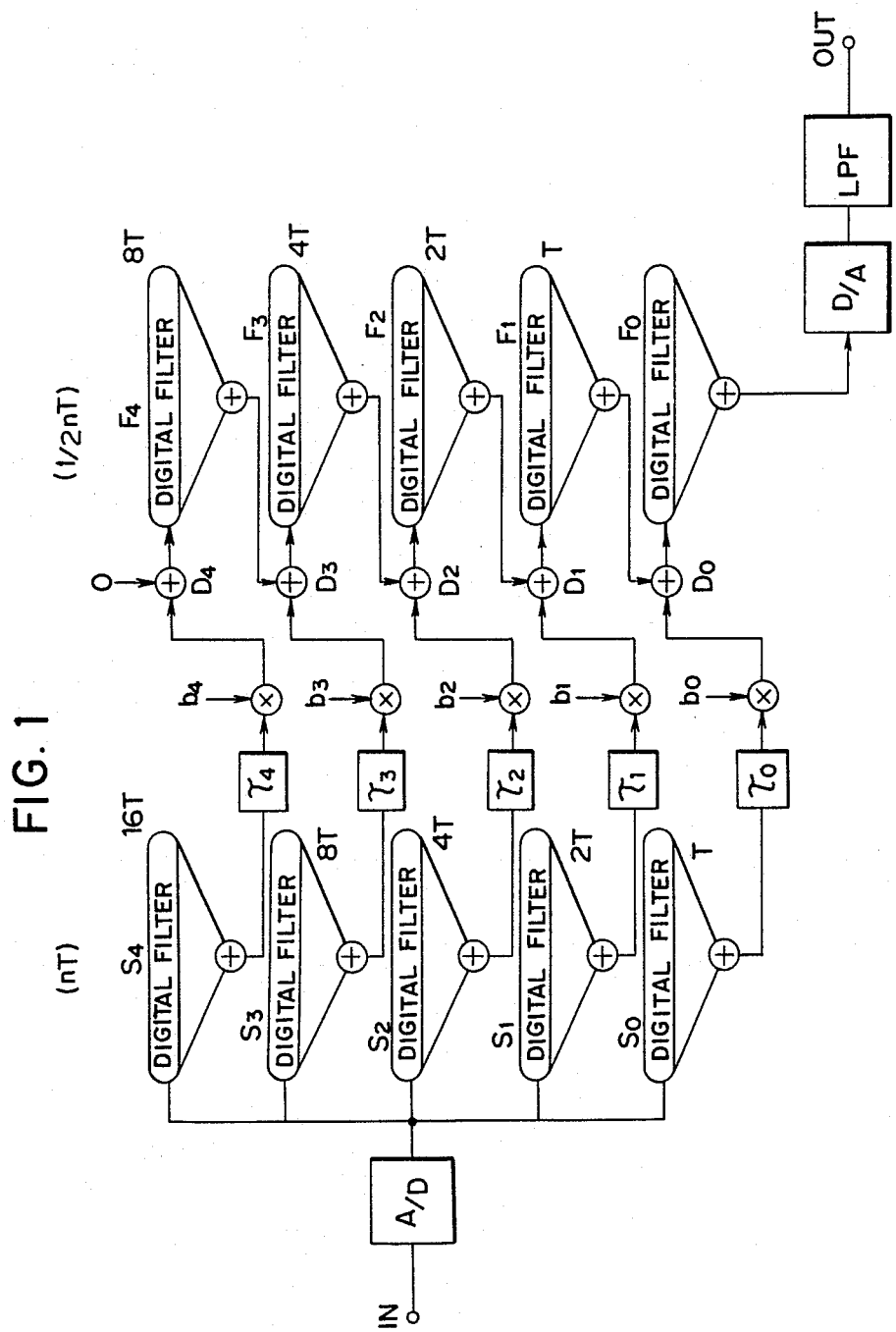
FIG. 1 is a block diagram illustrating an embodiment of this invention.

Hereinbelow this invention will be explained, referring to the embodiments indicated in the drawings, in which FIG. 1 shows an embodiment of octave multiple filters (5 octaves) according to the first invention of this application. In the figure, IN is an input terminal; OUT Is an output terminal; A/D is an A/D converter; D/A is a D/A converter; LPF is a usual analogue type low pass filter; $S_0 \sim S_4$ are digital filters having the band pass characteristics consisting of e.g. FIR type filters; $F_0 \sim F_4$ are digital filters having the low pass characteristics consisting of same type filters; and $D_0 \sim D_4$ are adder circuits.

Figure 2:
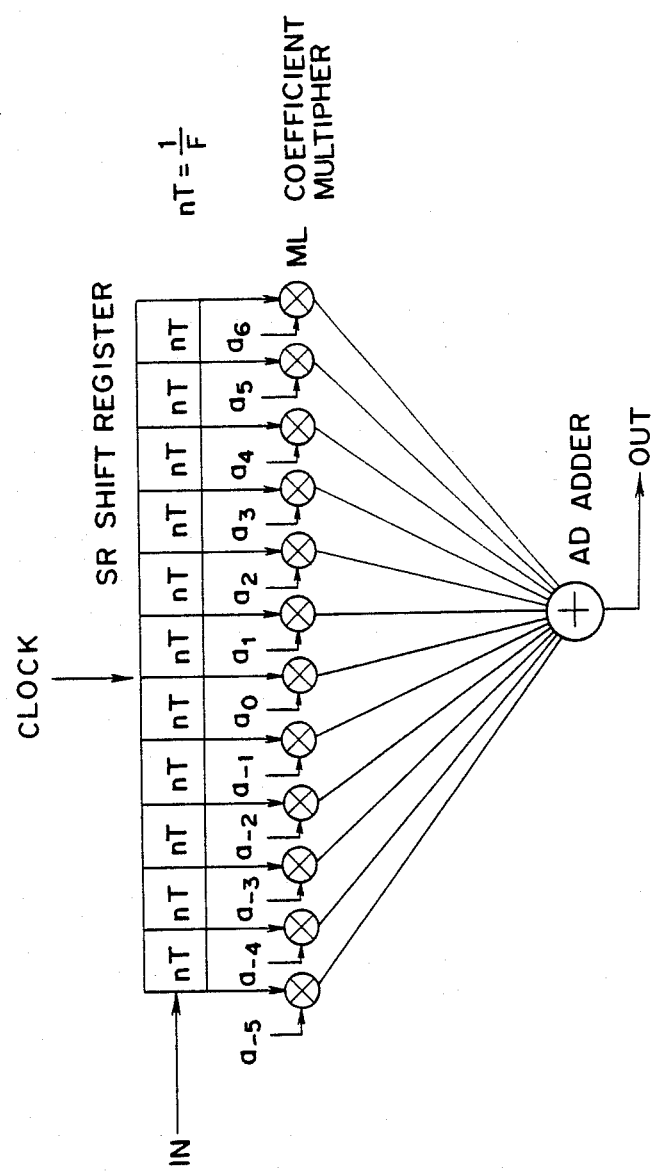
FIG. 2 is a scheme showing an example of construction of FIR type filters used in the embodiment indicated in FIG. 1.

Each of the FIR type filters described above consists of delay elements SR, coefficient multipliers ML and an adder AD, as indicated in FIG. 2. The coefficients $a\text{-}5 \sim a6$ of the coefficient multipliers ML are so determined that the aimed frequency characteristics can be obtained according to the DFT (discrete fourier transformation) method indicated in FIG. 3.

Figure 3A:
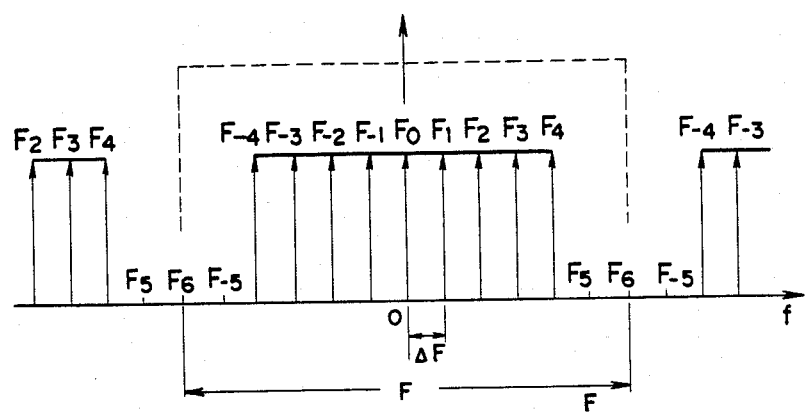
FIGS. 3(a) and 3(b) indicate characteristics of the filter.
Figure 3B:
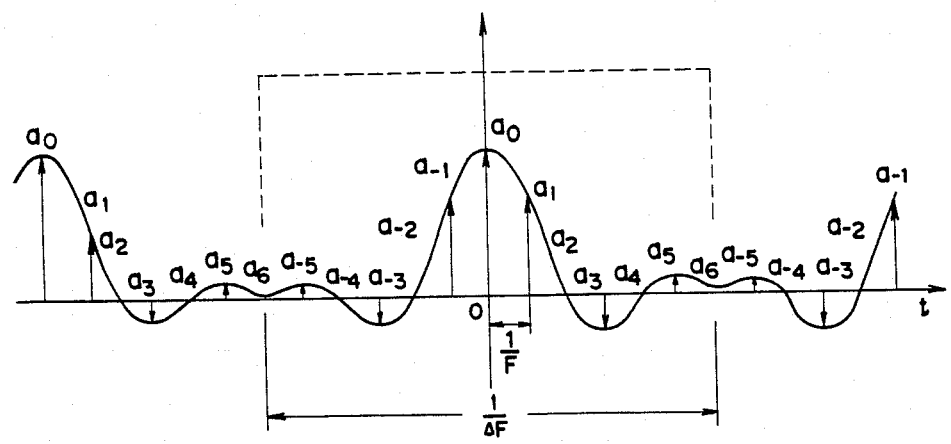

FIG. 3(a) indicates a function representing the aimed frequency characteristics (low pass characteristics and FIG. 3(b) indicates a function in the time domain obtained by an inverse discrete fourier transformation thereof.

The filter stages are arranged in parallel between the input and the output, each of which consists of a pair of a digital filter having the band pass characteristics and one having the low pass characteristics $(S_0, F_0) \sim (S_4, F_4)$.

In each of these filter stages the digital filter $S_0 \sim S_4$ having the band pass characteristics comprises delay elements $S_0\text{-}1 \sim S_4\text{-}5$, each of which operates with a delay time nT per stage is one of time intervals T, 2T, 3T, ..., each of which is an integer times as long as the reference time interval T, which is the sampling time interval for input signals in the A-D converter A/D. Further the digital filter $F_0 \sim F_4$ having the low pass characteristics comprises delay elements $F_0\text{-}1 \sim F_4\text{-}5$, each of which operates with a delay time per stage, which is equal to the delay time per stage of the delay element in the corresponding digital filter $S_0 \sim S_4$ having the band pass characteristics.

In addition, the adjacent filter stages are coupled with each other through an adder circuit $D_0 \sim D_5$ stated above. That is, a digital filter stage having the band pass characteristics or the low pass characteristics, which comprises delay elements operating with a longer delay time belongs to a higher rank (in the order of $S_4 \sim S_0$, $F_4 \sim F_0$). Thus the filter stages are so connected that the output of the digital filter having the band pass characteristics in each of the filter stages is added to the output of the digital filter having the low pass characteristics in the filter stage, which is higher by one rank than the relevant stage and inputted to the digital filter having the low pass characteristics in the relevant stage itself.

Now, in the octave multiple filter constructed as described above, the input signal is A-D converted with a sampling frequency $f_0$ (sampling rate $1/f_0$ sec) by the A-D converter A/D and inputted to the digital filters $S_0 \sim S_4$ having the band pass characteristics. This filter, e.g. $S_4$, is so constructed that the delay time per stage of the delay element constituting it is $1/f_0 2^{-4}$ sec. Usually a digital filter having such a structure is used with a clock frequency of $f_0 2^{-4}$ Hz and the sampling frequency of the input signal is also $f_0 2^{-4}$ Hz. In the structure described above, since the clock frequency and the sampling frequency are different, the aimed processing is not possible with the frequency as they are. For this reason, according to this invention, the coefficient of the FIR type filters is determined by setting the unit delay time to $1/f_0 2^{-4}$ sec, as described previously. Then, the clock frequency is set to $f_0$ Hz for the real input signal sampled with the interval of $1/f_0$ sec and the delay time per stage of the delay element $S_4\text{-}1$ is set to $nT = 1/f_0 2^{-4}$ sec with the coefficient, as it is. The digital filters of the other stages are set in the same way.

Figure 4:
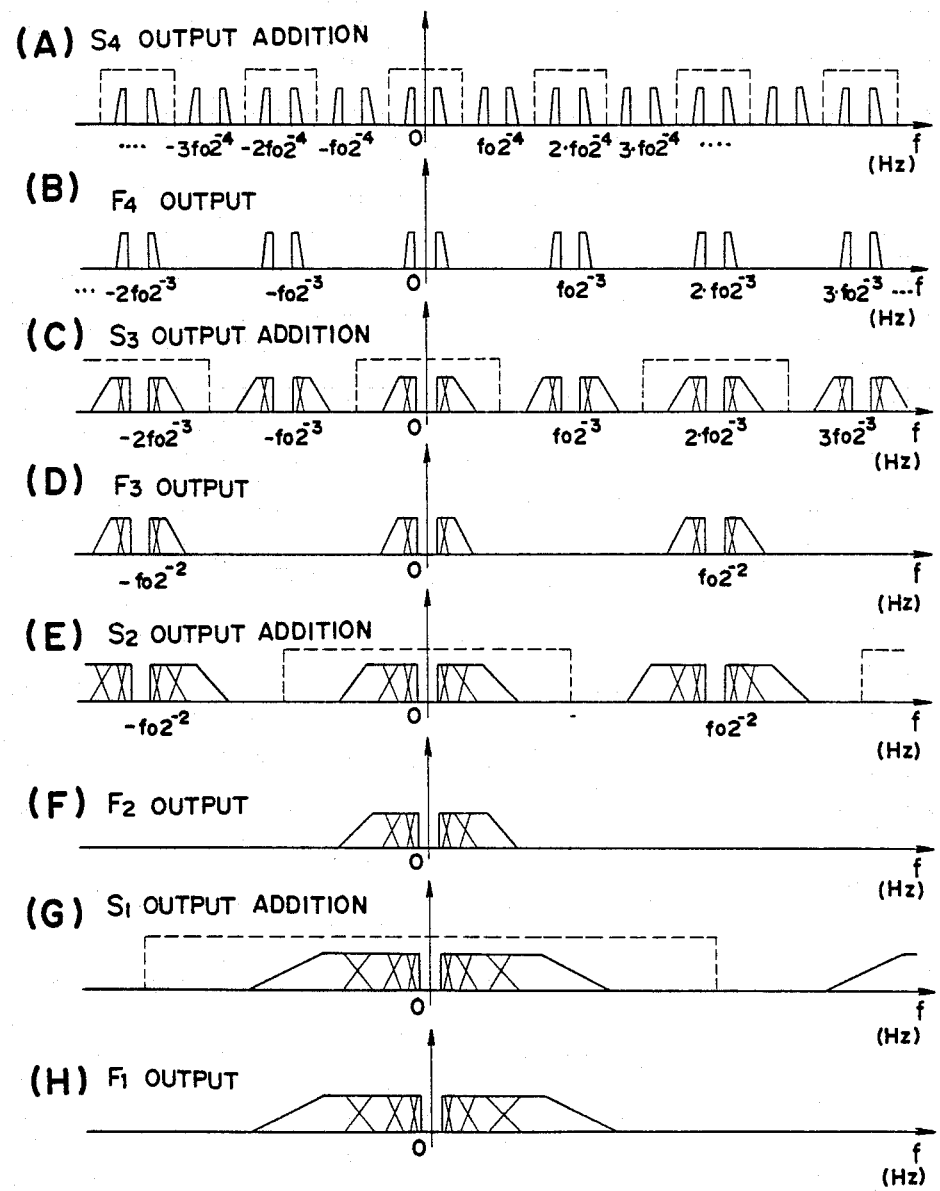
FIG. 4(a) to (h) indicate output characteristics of each of the digital filters in the above embodiments.

The output characteristics of the digital filter $S_4$ is as indicated in FIG. 4(a). Then, in order to eliminate its pass bands of the odd numbers, the output of the digital filter $S_4$ is inputted to the digital filter $F_4$ having the low pass characteristics, whose delay time per stage of the delay element is $1/f_0 2^{-3}$ sec. The output characteristics of $F_4$ is as indicated in FIG. 4(b). This output of $F_4$ is added to the output of the digital filter $S_3$ having the band pass characteristics, whose delay time per stage of the delay element is $1/f_0 2^{-3}$ sec, in the adder circuit $D_4$. FIG. 4(c) indicates the characteristics obtained by this addition.

Further, in order to eliminate its pass bands of the odd numbers, the output of the digital filter $S_3$ is inputted to the digital filter $F_3$ having the low pass characteristics, whose delay time per stage of the delay element is $1/f_0 2^{-2}$ sec. Thus, the output characteristics of $F_3$ is as indicated in FIG. 4(d).

Figure 5:
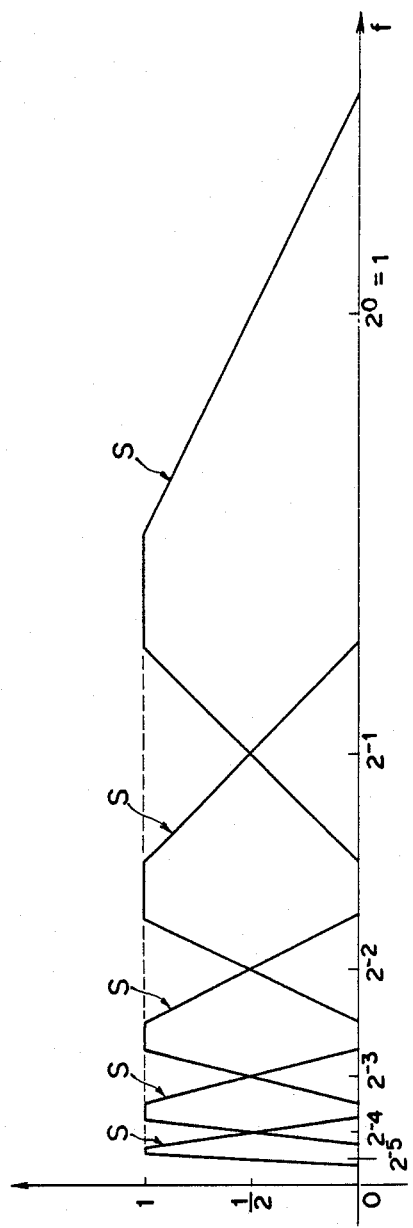
FIG. 5 indicates the aimed output characteristics.

Similar processing is repeated and an output having the aimed characteristics as indicated in FIG. 5 can be obtained from the last digital filter.

Figure 6:
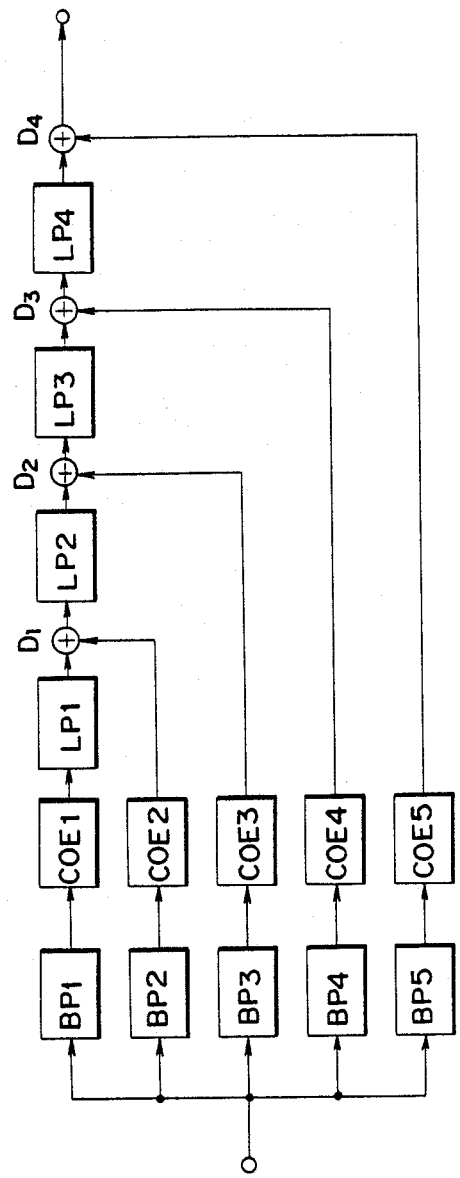
FIGS. 6 and 7 are block diagrams illustrating two other embodiments of this invention.
Figure 7:
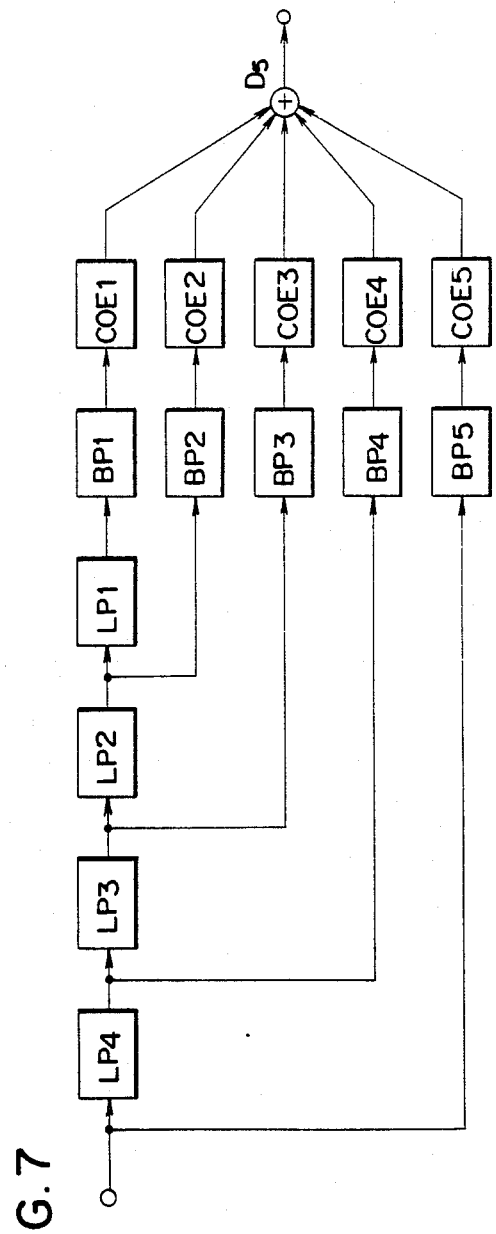

FIGS. 6 and 7 illustrate embodiments of the octave multiple filter according to the second and third invention of this application. The embodiment indicated in FIG. 6 is of parallel input type. That is, the sampled input signal is given to digital filters $BP1 \sim BP5$ having the band pass characteristics and connected in parallel and the output of each of them is given to the corresponding one of the digital filters $LP1 \sim LP4$ having the low pass characteristics and connected in series through an amplitude-phase coefficient controller $COE1 \sim COE5$. On the other hand the embodiment indicated in FIG. 7 is of series output type. That is, the output of each of the digital filters $LP4 \sim LP1$ having the low pass characteristics and connected in series is given to the corresponding one of the digital filters $BP5 \sim BP1$ having the band pass characteristics and connected in parallel. Then the output of each of them is inputted in an adder D5 through the corresponding one of amplitude-phase coefficient controllers $COE5 \sim COE1$, where they are added together and taken out.

In addition, in the embodiments indicated in FIGS. 6 and 7, the delay time per stage of the digital filter LP4, BP5 having the greatest number in the order of their connection is shorter than the sampling time instead of the input signal. Further the delay time per stage of the unit delay element in the digital filter is determined by multiplying the delay time of the filter having the preceding number by $A^B (A>1, B>0)$, every time the number is reduced by 1, in each of the digital filter group $LP1 \sim LP4$ and $BP1 \sim BP5$, and a digital filter having the low pass characteristics of arbitrary number operates with a delay time per stage of the unit delay element, which is n (n is an integer) times as long as the delay time per stage of the unit delay element in the digital filter having the band pass characteristics of the same number.

The embodiments indicated in FIGS. 6 and 7 are basically equivalent to that indicated above and their operating mode is identical thereto. In the embodiment indicated in FIG. 6 the unnecessary band components in the band pass output signal of each of the digital filter $BP1 \sim BP5$ having the band pass characteristics are eliminated one after another by the digital filter $LP1 \sim LP4$ having the low pass characteristics, while in the embodiment indicated in FIG. 7, each band pass characteristic output of the filters $BP1 \sim BP5$ is multiplied by the corresponding low pass output signal of the filters $LP1 \sim LP4$, whose pass band is made narrower one after another.

Figure 8:
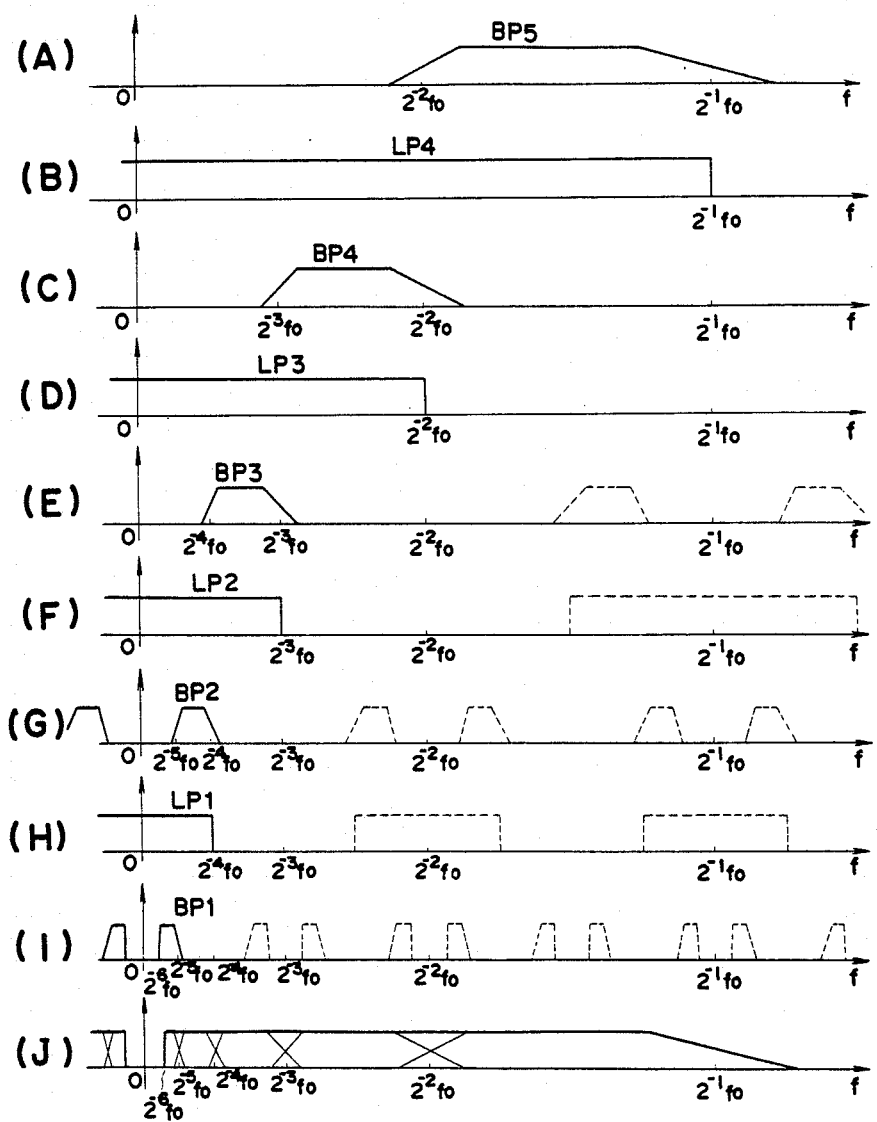
FIG. 8(a) to (j) indicate output characteristics of each of the digital filters in the embodiment indicated in FIG. 7.

FIG. 8 indicates the output characteristics of each of the digital filters, in the case where $A^B = 2^1$ and $n=2$, which is one of embodiments illustrated in FIG. 7.

In the embodiment in the FIG. 6, in the case where random access memories (RAM) are used as the delay element for each of the filters in the input stage of the digital filter group having the band pass characteristics, since they can be used in common for the filters, memories can be saved and the design is simplified correspondingly.

The embodiment indicated in FIG. 7 is suitable for use for which other functions are added thereto, because components of each of the bands can be taken out separately.

Figure 9:
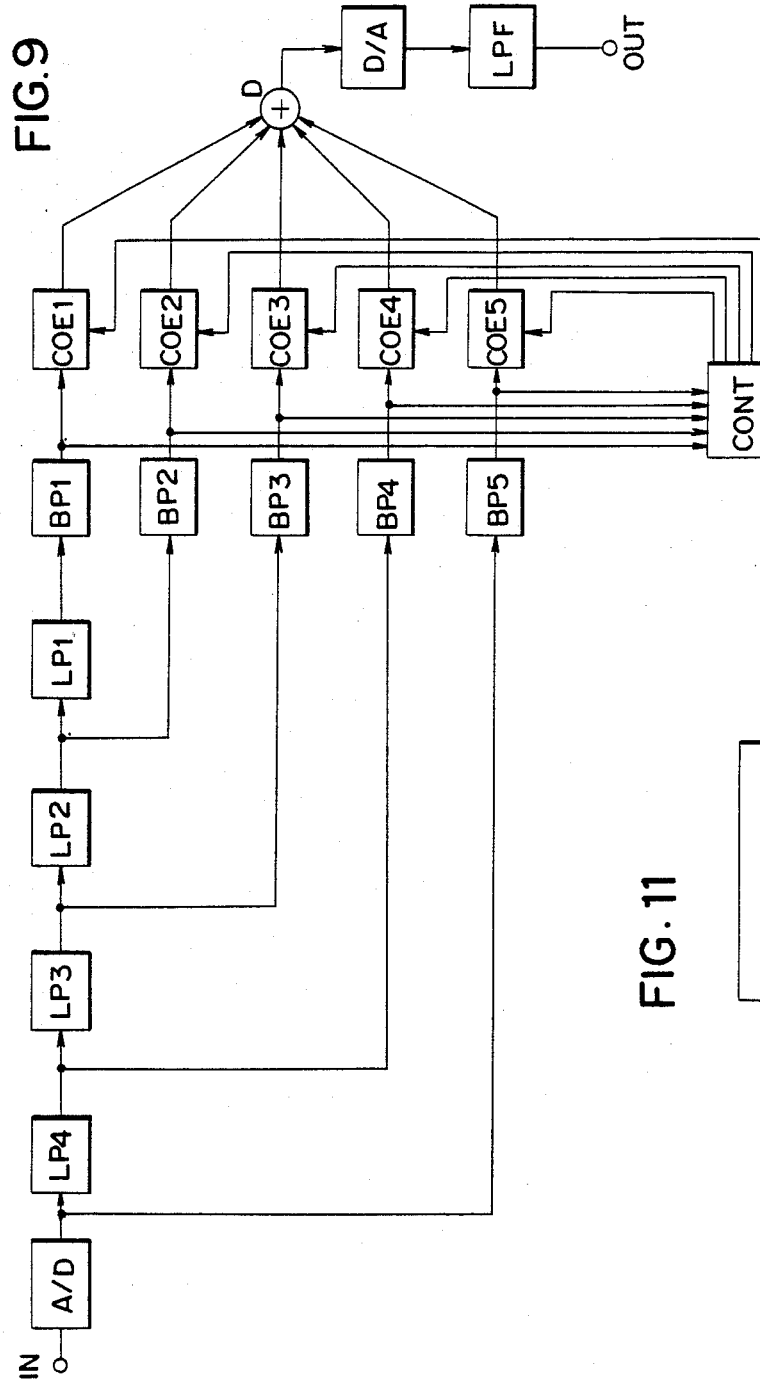
FIG. 9 is a block diagram illustrating still another embodiment of this invention.

FIG. 9 illustrates an embodiment of octave multiple filters (5 octaves) according to this invention. In the figure, IN is an input terminal; OUT is an output terminal; A/D is an A-D converter; D/A is a D-A converter; LPF is a usual analogue type low pass filter; $LP1 \sim LP4$ are digital filters having the low pass characteristics consisting of e.g. FIR type filters; $BP1 \sim BP5$ are digital filters having the band pass characteristics consisting of filters of same type; D is an adder circuit; COE1~COE5 are amplitude-phase coefficient controllers; and CONT is an adaptive control circuit.

Figure 10:
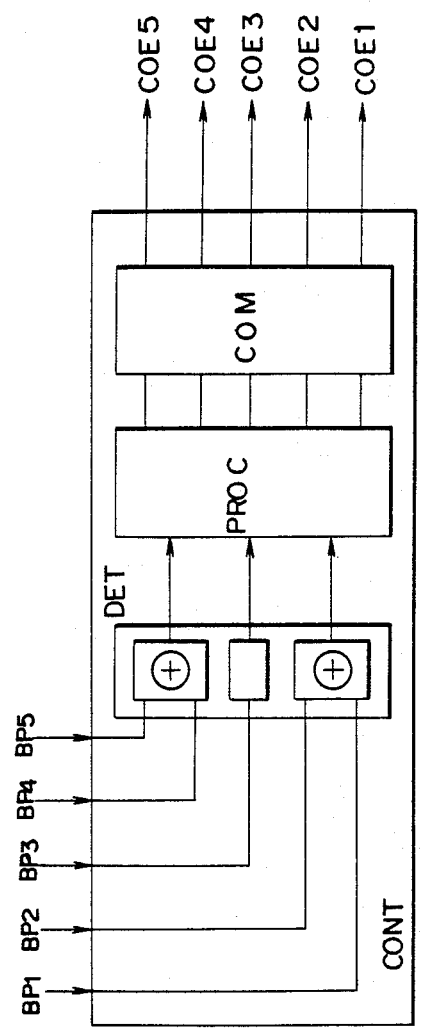
FIG. 10 is a scheme showing an example of construction of adaptive control circuits used in the embodiment indicated in FIG. 9.

The adaptive control circuit CONT is constructed e.g. as indicated in FIG. 10. In the figure, DET is a detector for the components in the signal bans, PROC is a microprocessor and COM is a control signal generator circuit. The digital filters LP1~LP4 having the low pass characteristics are connected in series and the digital filters BP1~BP5 having the band pass characteristics are connected in parallel. The output of each of the filters LP1~LP4 is given to the corresponding filter BP1~BP5. The output of each of the filters BP1~BP5 is inputted to the adder circuit D through the corresponding amplitude-phase coefficient controller COE1~COE5, where they are added together and taken out. At the same time the output of the adder circuit D is given also to the adaptive control circuit CONT. The octave multiple filter indicated in the figure is so constructed that the amplitude and phase constant of each of the amplitude-phase coefficient controllers COE1~COE5 are adaptively controlled by the circuit CONT, depending on the output of each of BP1~BP5.

The delay time nT per stage of the unit delay element in the digital filters LP4 and BP5 having the greatest among the numbers attached to the filters in each of the digital filter groups according to the order of their connection is set to be shorter than the sampling time interval T. Further, every time the number of the filter is reduced by 1, the delay time per stage of the unit delay element is determined by multiplying the delay time of the filter having the preceding number by $A^B(A>1, B>0)$ and the unit delay element in the digital filter having the low pass characteristics of an arbitrary number operates with a delay time, which is an integer times as long as the delay time per stage of the unit delay element in the digital filter having the band pass characteristics of the same number.

In addition, the adaptive control circuit CONT separates the signal into components in 3 bands, e.g. in BP1 and BP2, BP3, BP4 and BP5 by detecting the output of each of the digital filters BP1~BP5 having the band pass characteristics by means of detectors DET for components in the signal bands. The microprocessor PROC calculates the amplitude and phase coefficient for each of the amplitude-phase coefficient, controller COE1~COE5; depending on the components in each of the bands, and the control signal generator circuit COM sends predetermined control signals to the coefficient controllers described above, responding to the calculation results thus obtained, in order to control the coefficient for each of the controllers.

Figure 11:
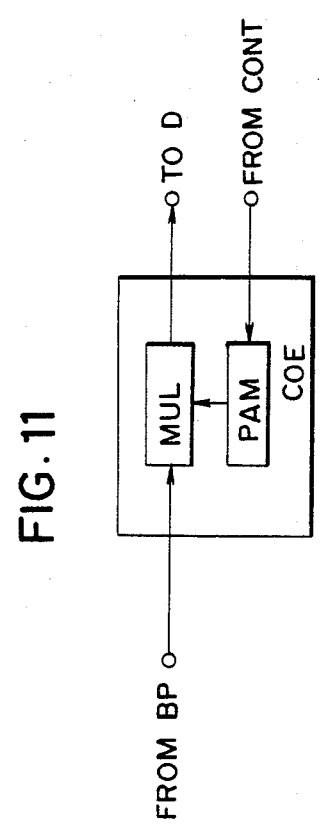
FIG. 11 is a scheme showing an example of construction of coefficient controller circuits used in the embodiment indicated in FIG. 9.

Each of the coefficient controllers described above consists of e.g. an RAM and a multiplier MUL, as indicated in FIG. 11. Each of the coefficients is set in the RAM and the phase is varied by the offset of the timing for taking out the coefficients from the RAM, responding to the control signal described previously. The amplitude is varied by multiplying each of the outputs of BP1~BP5 by the corresponding coefficient thus taken out in the multiplier MUL. It is also possible that the above RAM can be used in common as the RAM in the digital filters having the band pass characteristics. Although, in this embodiment, the output of each of the coefficient controllers is varied by varying each of the coefficients, depending on the output of BP1~BP5, as described previously, in the system arrangement indicated in FIG. 9 no feedback is produced in the system illustrated in the figure, and thus the system is stable.

In the octave multiple filter constructed as described above, the input signal given to the input terminal IN is A-D converted with the sampling frequency $f_0$ (sampling rate $1/f_0$ sec) by the A-D converter A/D and applied to the digital filters LP4 and BP5 having the greatest number among the filters having the low pass characteristics and those having the band pass characteristics. In this filter, e.g. LP4, the delay time per stage of the delay element constituting it is $1/f_0 2^{-4}$ sec. Usually a digital filter having such a structure is used with a clock frequency of $f_0 2^{-4}$ Hz and the sampling frequency of the input signal is also $f_0 2^{-4}$ Hz. In the structure described above, since the clock frequency and the sampling frequency are different, the aimed processing is not possible with frequency as they are. For this reason the coefficient of the FIR type filters is determined by setting the unit delay time to $1/f_0 2^{-4}$ sec, as described previously. Then, the clock frequency is set to $f_0$ Hz for the real input signal sampled with the interval of $1/f_0$ sec and the delay time per stage of the unit delay element is set to $nT = 1/f_0 2^{-4}$ sec with the coefficient, as it is. The digital filters of the other stages are set in the same way.

The characteristics of each of the digital filters BP5~BP1 and those of each of the digital filters LP4~LP1 are as indicated in FIGS. 12(a)-(i) repsectively. As can be seen in the figures, the band is made narrower successively. The band pass characteristics of each of BP5-BP1 and the coefficient of each of the coefficient controllers are multiplied by the output signal of the corresponding digital filter LP4~LP1 having the low pass characteristics and an aimed output as indicated in FIG. 12(j) can be obtained.

As it is clear from the above explanation, according to this invention, since the characteristics can be specified with logarithmically uniform intervals in the frequency region and the band can be enlarged towards the lower frequency region owing to the structure described above, its resolution can be increased. In addition, it is possible to specify the amplitude and the phase independently and also to reduce arbitrarily the interference between different filters.

In particular, according to the embodiment of the fourth invention, owing to the structure, by which the phase and the amplitude can be controlled adaptively depending on the input signal, the following effects can be obtained.

Firstly, it is possible to construct easily a system, which is equivalent to a noise reduction system for an analogue magnetic tape system by varying adaptively the amplitude characteristics.

Secondly, waveforming, compensation, etc. for the rising characteristics, etc. of the input signal varying rapidly are possible by varying adaptively the phase.

In this way, if these effects are combined, by preparing various programs for the coefficient calculation it is possible to meet the needs for various systems such as different noise reduction, enhancers, etc. and to have special effects or functions such as automatic sound field correction, surround sound field, etc.

The embodiments of the invention in which an exclusive property or privilege is claimed are defined as follows:

1. An octave multiple filter comprising:
   means for sampling input signals; and a plurality of filter stages coupled to the output of the sampling means so that the sampled input signals are given them in parallel, each of the filter stages comprising a pair of digital filters, one having band pass characteristics and the other having low pass characteristics, and being driven by clock signals having a time interval, which is equal to the sampling time interval; said digital filters having the band pass characteristics including delay elements having a delay time per stage equal to an integer multiple of said sampling time interval; said digital filters having the low pass characteristics including delay elements having a delay time equal to an integer fraction of the delay time of the delay element of the band pass characteristic filter of the stage, each of said filter stages being coupled so that a digital filter stage having the band pass characteristics and the low pass characteristics including delay elements driven with a longer delay time belongs to a higher rank and that the output of the digital filter having the band pass characteristics in the relevant filter stage is added to the output of the digital filter having the low pass characteristics in the filter stage, which is higher in rank by 1 than the relevant filter stage, and then inputted to the digital filter having the low pass characteristics in the relevant filter stage itself.

2. An octave multiple filter comprising:
means for sampling input signals; and
a plurality of digital filter groups, one having band pass characteristics and the other having low pass characteristics, driven by clock signals having a time interval, which is equal to the sampling time interval; the filters in the digital filter group having the low pass characteristics being connected in series; the filters in the digital filter group having the band pass characteristics being connected in parallel; the sampled input signals being given to each of the filters in the digital filter group having the band pass characteristics; the output of each of the filter in the digital filter group having the band pass characteristics being given to a corresponding filter in the digital filter group having the low pass characteristics; the filters in each of the digital filter groups being numbered according to the order of their connection; the delay time per stage of the unit delay element in the digital filter having the greatest number being shorter than the sampling time interval of the input signals; in each of the digital filter groups, every time the number of the filter is reduced by 1, the delay time per stage of the digital filter being determined by multiplying the delay time of the filter having the preceding number by $A^B (A>1, B>0)$; the delay time per stage of the unit delay element in the digital filter having the low pass characteristics being an arbitrary number which is an integer fraction of the delay time per stage of the unit delay element in the digital filter having the band pass characteristics of the same number.

3. An octave multiple filter comprising:
means for sampling input signals; and
a plurality of digital filter groups, one having band pass characteristics and the other having low pass characteristics, driven by clock signals having a time interval, which is equal to the sampling time interval; the filters in the digital filter group having the low pass characteristics being connected in series to the output of the sampling means; the filters in the digital filter group having the band pass characteristics being connected in parallel; the output of each of the filters in the digital filter group having the low pass characteristics and the output of the sampling means being given to a corresponding filter in the digital filter group having the band pass characteristics; at the same time the outputs of the filters in the digital filter group having the band pass characteristics being added together and taken out; the filters in each of the digital filter groups being numbered according to the order of their connection; the delay time per stage of the unit delay element in the digital filter having the greatest number being shorter than the sampling time interval of the input signals; in each of the digital filter groups, every time the number of the filter is reduced by 1, the delay time per stage of the digital filter being determined by multiplying the delay time of the filter having the preceding number by $A^1 (A>1, B>0)$; the delay time per stage of the unit delay element in the digital filter having the low pass characteristics being an arbitrary number which is an integer fraction of the delay time per stage of the unit delay element in the digital filter having the band pass characteristics of the same number.

4. An octave multiple filter comprising:
means for sampling input signals;
a plurality of digital filter groups, one having band pass characteristics and the other having low pass characteristics, driven by clock signals having a time interval, which is equal to the sampling time interval; the filters in the digital filter group having the low pass characteristics being connected in series to the output of the sampling means; the filters in the digital filter group having the band pass characteristics being connected in parallel; the output of each of the filters in the digital filter group having the low pass characteristics and the output of the sampling means being given to a corresponding filter in the digital filter group having the band pass characteristics; at the same time the outputs of the filters in the digital filter group having the band pass characteristics being added together through each of amplitude-phase coefficient controller circuits and taken out; the filters in each of the digital filter groups being numbered according to the order of their connection; the delay time per stage of the unit delay element in the digital filter having the greatest number being shorter than the sampling time interval of the input signals; in each of the digital filter groups, every time the number of the filter is reduced by 1, the delay time per stage of the digital filter being determined by multiplying the delay time of the filter having the preceding number by $A^B (A>1, B>0)$; the delay time per stage of the unit delay element in the digital filter having the low pass characteristics being an arbitrary number which is an integer fraction of the delay time per stage of the unit delay element in the digital filter having the band pass characteristics of the same number; and
control means for controlling the amplitude-phase constant of each of said amplitude-phase coefficient controller circuits, depending on the output signal of each of the filters in the associated digital filter group.

* * * * *

UNITED STATES PATENT AND TRADEMARK OFFICE
CERTIFICATE OF CORRECTION

PATENT NO. : 4,779,217

DATED : Oct. 18, 1988

INVENTOR(S) : Takeda et al.

It is certified that error appears in the above-identified patent and that said Letters Patent is hereby corrected as shown below:

Title page:

[75] Inventors: Change "Hiroo Uwaba" to --Hiroo Uwabu--.

Signed and Sealed this

Seventh Day of March, 1989

Attest:

DONALD J. QUIGG

Attesting Officer

Commissioner of Patents and Trademarks